US 6,662,725 B1

(12) United States Patent
Koizumi et al.

(10) Patent No.: US 6,662,725 B1
(45) Date of Patent: Dec. 16, 2003

(54) POSITIONING METHOD AND POSITIONING DEVICE FOR POSITIONING PRINTING PLATE RELATIVE TO SURFACE PLATE

(75) Inventors: Takashi Koizumi, Kanagawa (JP);
Kazuoki Komiyama, Kanagawa (JP);
Yoshinori Kawamura, Kanagawa (JP);
Yoshihiro Koyanagi, Kanagawa (JP);
Mitsuyoshi Nishimura, Saitama (JP);
Takashi Kato, Saitama (JP)

(73) Assignees: Fuji Photo Film Co., Ltd., Kanagawa (JP); Fuji Photo Optical Co., Ltd., Saitama (JP)

( * ) Notice: Subject to any disclaimer, the term of this patent is extended or adjusted under 35 U.S.C. 154(b) by 13 days.

(21) Appl. No.: 09/664,440

(22) Filed: Sep. 18, 2000

(30) Foreign Application Priority Data

Sep. 17, 1999 (JP) .............................. 11-264231

(51) Int. Cl.⁷ .......................... B41F 1/32; B41L 47/14; B41C 1/00
(52) U.S. Cl. ...................... 101/486; 101/477; 101/481; 101/474; 33/617; 33/645; 271/232; 355/73
(58) Field of Search ................. 101/477, 481, 101/485, 486, 389.1, DIG. 36, 463.1, 474; 33/614, 617, 621, 613, 619, 620, 645; 271/271, 232, 185, 194, 236; 355/72, 73, 76; 248/362, 346.03

(56) References Cited

U.S. PATENT DOCUMENTS

| | | | | |
|---|---|---|---|---|
| 2,565,054 A | * | 8/1951 | Watrous | ...................... 271/236 |
| 4,389,156 A | * | 6/1983 | Dennhardt et al. | .......... 101/477 |
| 4,462,678 A | * | 7/1984 | Back | ........................... 399/166 |
| 4,491,313 A | * | 1/1985 | Schoen | ....................... 271/194 |
| 4,533,239 A | * | 8/1985 | Back | ........................... 271/236 |
| 5,156,253 A | | 10/1992 | Pedersen | |
| 5,255,607 A | * | 10/1993 | Nishiyama et al. | ...... 101/463.1 |
| 5,634,406 A | * | 6/1997 | Lindner et al. | ............. 101/477 |
| 5,718,057 A | * | 2/1998 | Rosli et al. | .......... 101/DIG. 36 |

FOREIGN PATENT DOCUMENTS

JP         10-272752         10/1998

OTHER PUBLICATIONS

Patent Abstract of Japan 10272752 Oct. 13, 1998.
Patent Abstracts of Japan, vol. 009, No. 055 (M–362), Mar. 9, 1985 & JP 59 190145 A (Konishiroku Shashin Kogyo KK), Oct. 27, 1984, *abstract*.
Patent Abstracts of Japan, vol. 1998, No. 05, Apr. 30, 1998 & JP 10 022698 A (Hitachi LTD), Jan. 23, 1998, *abstract*.

* cited by examiner

*Primary Examiner*—Leslie J. Evanisko
(74) *Attorney, Agent, or Firm*—Sughrue Mion, PLLC

(57) ABSTRACT

A printing plate is held at one point thereof by a holding portion provided at a surface plate. When pushed by a pushing portion, the printing plate is only rotationally displaced. Thus, an angular error is substantially eliminated and displacement of the printing plate is small. Then, the pushing portion positions the printing plate in a direction perpendicular to a direction in which the surface plate can be moved. Then, movement of the surface plate positions the printing plate in the direction in which the surface plate can be moved.

23 Claims, 13 Drawing Sheets

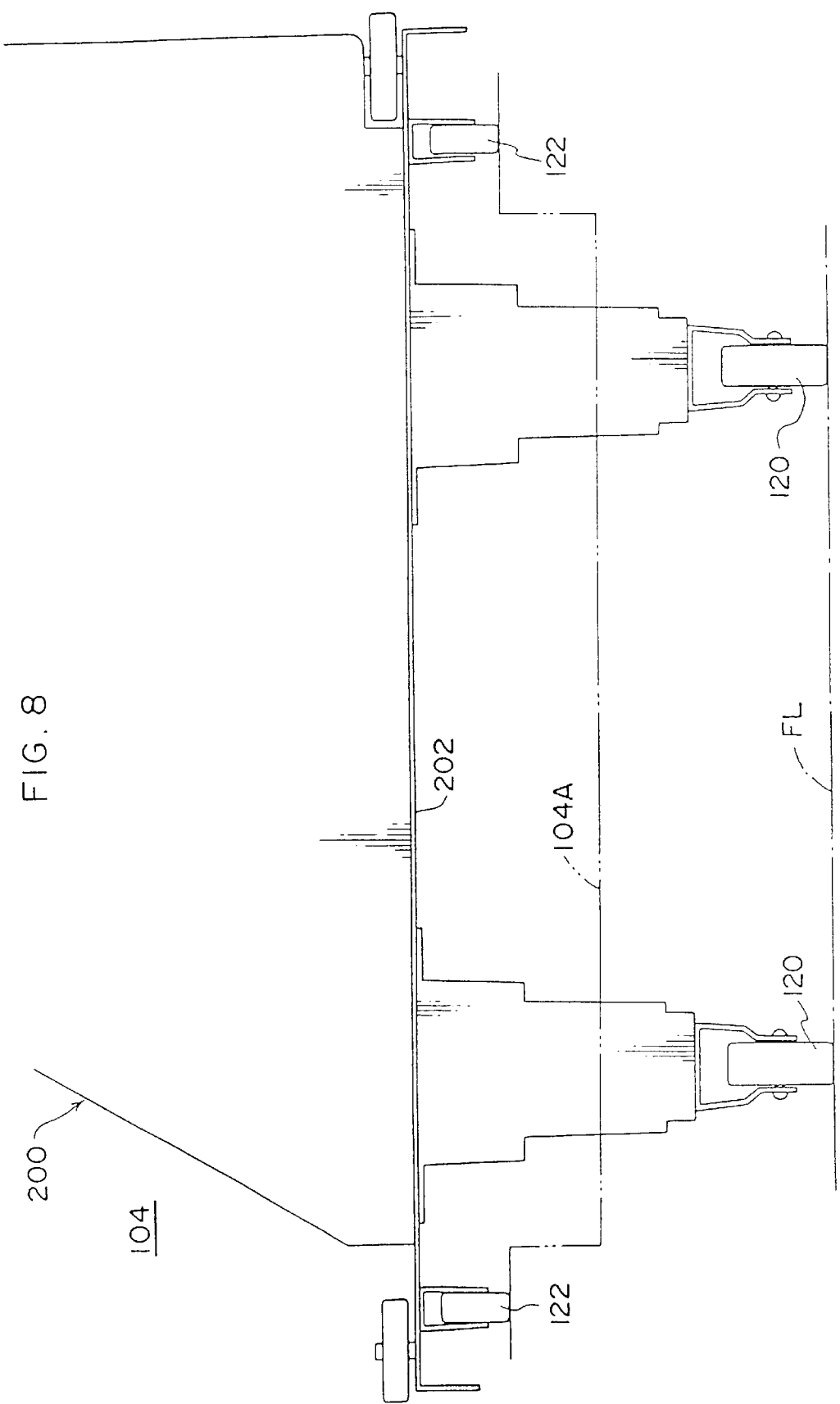

POSITIONING METHOD AND POSITIONING DEVICE FOR POSITIONING PRINTING PLATE RELATIVE TO SURFACE PLATE

BACKGROUND OF THE INVENTION

1. Field of the Invention

The present invention relates to a printing plate mounted on a surface plate which is a stage for exposure and the like, and a method and a device for positioning the printing plate at a position relative to the surface plate.

2. Description of the Related Art

Technology (printing plate automatic exposure devices) has been developed whereby an image is recorded onto a printing plate. The printing plate (e.g., a presensitized plate, a thermal plate, a photopolymer plate or the like) is provided with a recording layer on top of a base layer. The image is recorded at a printing plate's photopolymerization layer with a direct laser beam or the like.

With this sort of technology, images can be recorded onto printing plates quickly. Therefore, sequential feeding of the printing plates is required. A plurality of printing plates are prepared in a stacked state at a predetermined position beforehand. The printing plates are automatically taken one at a time, positioned on the surface plate, and fed into an exposure portion. In some cases, punched holes are provided for positioning the printing plates at the plate cylinder of the printing machine before or after feeding to the exposure portion. Therefore, positioning each of the printing plates on the surface plate is an important operation.

Conventionally, in cases in which the printing plate is placed on the surface plate and then positioned, pins that can abut against the face of the surface plate are provided at the rim of the face of the surface plate (at two adjacent sides). These pins push the printing plate at the corresponding two sides. The pins apply force and thereby effect positioning of the printing plate.

However, in the aforementioned conventional positioning method, the displacement of the printing plate is large, and a corresponding amount of space must be guaranteed.

When the printing plate is placed on the surface plate, if it is placed in an angled state, displacement for positioning is particularly great, and positioning cannot be done quickly.

Moreover, positioning pins and displacement mechanisms for pushing from the two directions are needed. Hence, the number of components increases. Moreover, such displacement mechanisms are attached to the surface plate. Therefore, the surface plate's weight increases and the torque required to move the surface plate must increase.

SUMMARY OF THE INVENTION

In view of the aforementioned, an object of the present invention is to provide a method and a device for positioning a printing plate wherein highly accurate positioning of the printing plate at a position relative to a surface plate can be done with a short stroke, the surface plate can be lightened by reducing the number of components in the surface plate, and the torque for displacement can be reduced.

A first aspect of the present invention is a method for positioning a printing plate, which has been placed on a surface plate, relative to the surface plate, including the step of rotating the printing plate by pushing an edge thereof for thereby substantially eliminating an angular error.

In the first aspect of the present invention the printing plate is pushed, for example, by a plate movable along a predetermined direction. The printing plate is pushed from only one edge. Thus, the printing plate rotates and the angular error can be substantially eliminated.

A second aspect of the present invention is a method for positioning a printing plate, which has been disposed on a surface plate, relative to the surface plate wherein the printing plate and surface plate are movable in a first direction relative to one another, the method including the step of rotating the printing plate, while holding the printing plate at a point, about the point by pushing an edge of the printing plate for thereby substantially eliminating an angular error with respect to the surface plate.

In the second aspect of the present invention, while one side of the printing plate is being pushed, one point of the printing plate's surface is held. The means of holding may be suction at a small hole provided at the surface plate, which suction holds the one point, or the means of holding may be a spherical body and the like above the printing plate, which body presses with a non-sharp-cornered member and holds by gripping the printing plate between this member and the surface plate. Such a member should be free of sharp corners, so as to prevent damage to the printing plate.

When the printing plate is held at one point and pushed from one side, if the printing plate is oblique, it adjusts by rotating about the one point. Thus, obliqueness is substantially eliminated with little displacement in X and Y directions relative to the surface plate. Hence, obliqueness can be substantially eliminated in a small space.

A third aspect of the present invention is a method for positioning a printing plate, which has been disposed on a surface plate, relative to the surface plate wherein the printing plate and surface plate are movable along a first direction relative to one another, the method including the steps of: (a) rotating the printing plate, while holding the printing plate at a point, about the point by pushing an edge of the printing plate for thereby substantially eliminating an angular error with respect to the surface plate; (b) continuing the pushing, thereby positioning the printing plate in a second direction substantially orthogonal to the first direction; (c) subsequently moving the surface plate in the first direction, thereby positioning the printing plate in the first direction using a plurality of printing plate detection sensors; and (d) setting a resultant position of the surface plate as an initial position.

In the third aspect of the present invention, when substantial elimination of obliqueness, as in the second aspect, is complete, the printing plate is positioned in the X direction, which is orthogonal to the Y direction (a direction in which the surface plate can be moved).

When positioning in the X direction is complete, positioning in the Y direction is carried out. In the third aspect, the positioning in the Y direction is not done by altering the position of the printing plate relative to the surface plate, but by moving the surface plate itself in the Y direction. This movement is monitored by a plurality of sensors. When the printing plate reaches a predetermined position, the movement stops.

When at this position, the printing plate has been properly positioned. However, the surface plate has moved from an original position thereof. Therefore, the position of the surface plate after the movement is recognized as being an initial position.

Hence, the printing plate and surface plate are effectively positioned at an appropriate position and operations such as, for example, punching of punch holes and exposure processing can be performed accurately.

A fourth aspect of the present invention is a printing plate positioning device for positioning a printing plate relative to a surface place, wherein the printing plate has been moved onto the surface plate from a predetermined transport path, the device including: (a) a movable body disposed proximate a side of the surface plate, the movable body being movable towards and away from the surface plate; (b) a plurality of sensors operable for detecting the printing plate presence at predetermined positions; and (c) a first holding portion and a second holding portion provided at the surface plate, for holding the printing plate.

A fifth aspect of the present invention is a printing plate positioning device for positioning a printing plate relative to a surface plate, wherein the printing plate has been moved onto the surface plate from a predetermined transport path, the device including: a holding device provided at a surface of the surface plate, the holding device holding the printing plate on the surface plate such that the printing plate is rotatable with respect to the surface plate about one point of the printing plate; and a pushing device disposed proximate a side of the surface plate, the pushing device pushing an edge of the printing plate while the printing plate is held by the holding device and thereby rotating the printing plate about the one point of the printing plate for thereby substantially eliminating an angular error with respect to the surface plate in a direction of rotation.

A sixth aspect of the present invention is a printing plate positioning device for positioning a printing plate, which has been disposed on a surface plate, relative to the surface plate wherein the surface plate is movable along a certain direction, the device including: a holding device provided at a surface of the surface plate, the holding device holding the printing plate on the surface plate such that the printing plate is rotatable with respect to the surface plate about one point of the printing plate; a first pushing device disposed proximate a side of the surface plate, the first pushing device pushing an edge of the printing plate while the printing plate is held by the holding device and thereby rotating the printing plate about the one point of the printing plate for thereby substantially eliminating in a direction of rotation an angular error with respect to the surface plate; a second pushing device disposed proximate a side of the surface plate, the second pushing device pushing an edge of the printing plate after the first pushing device has substantially eliminated the angular error, for thereby positioning the printing plate along a first direction substantially orthogonal to the certain direction; and a detection portion operable for detecting a position along a second direction of the printing plate at a time when the printing plate is moved along the certain direction by movement of the surface plate after the printing plate has been positioned along the first direction, wherein the printing plate is positioned in accordance with the detection portion, and a resultant position of the surface plate is set as an initial position.

In the sixth aspect of the present invention, the first pushing device and the second pushing device are preferably consitituted by a single pushing device which performs substantial elimination of the angular error and positioning along the first direction in a continuous manner.

If a single pushing device is used in the sixth aspect of the present invention, the printing plate positioning device can be made smaller. Also, the printing plate can be positioned in a shorter time.

In the fifth and sixth aspects of the present invention, it is preferable for the printing plate positioning device to further include a punching device proximate a transport direction back end edge of the printing plate for punching punch holes along an edge portion of the printing plate after the printing plate has been positioned along the first direction and the second direction.

Consequently, when the printing plate and the surface plate have been positioned at a suitable position, punch holes can be provided in the printing plate with high accuracy.

BRIEF DESCRIPTION OF THE DRAWINGS

FIG. 8 is an enlarged side view of a bottom portion of a trolley.

DESCRIPTION OF THE PREFERRED EMBODIMENTS

Overall Structure

Figure 1:
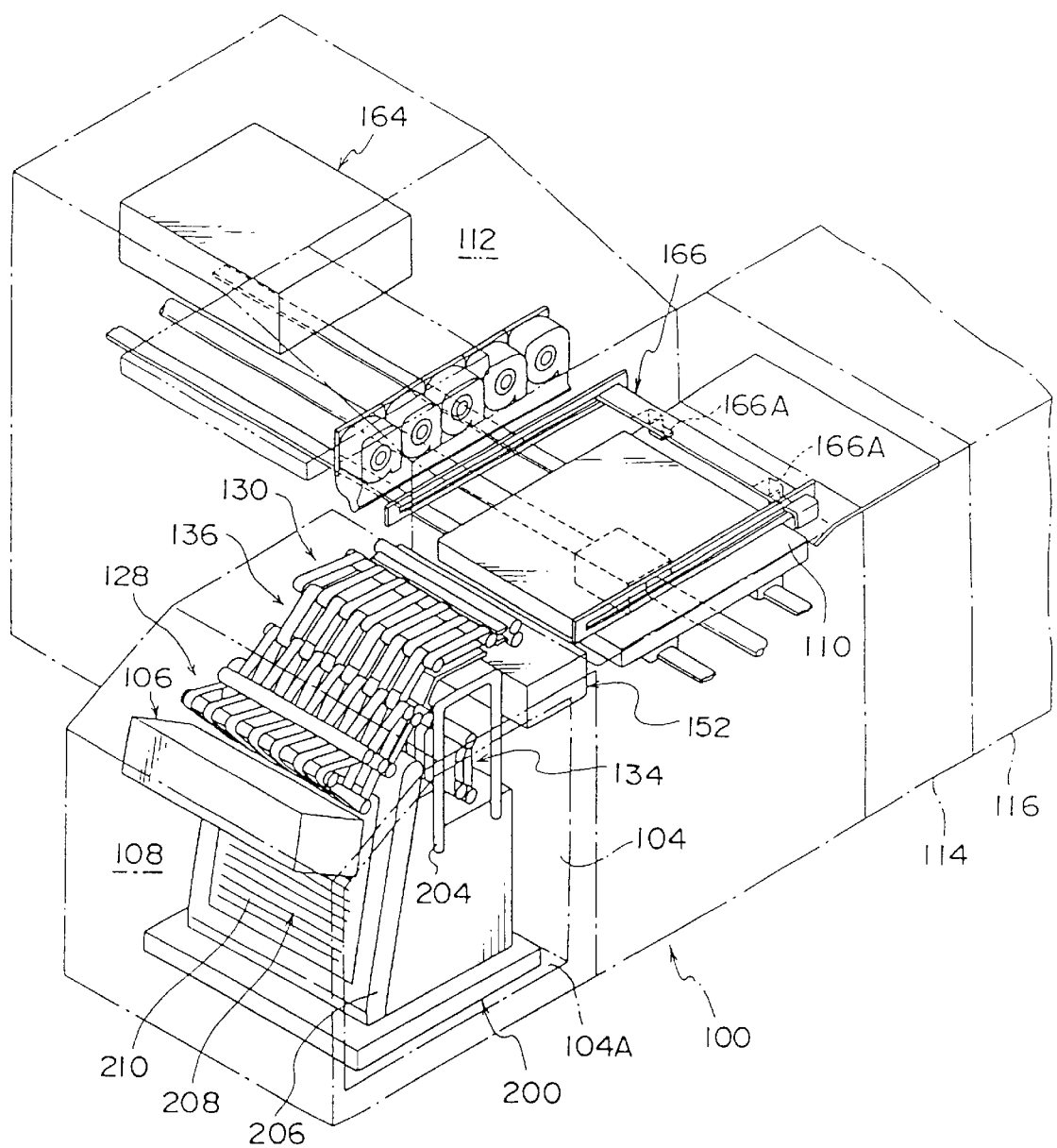
FIG. 1 is a perspective view showing an overall structure of an automatic exposure device relating to a first embodiment of the present invention.

FIG. 1 shows a photopolymer plate automatic exposure device 100 relating to an embodiment of the present invention.

The automatic exposure device 100 is formed by a plate feed section 108, a surface plate 110 and an exposure section 112. The plate feed section 108 is provided with a plate accommodation section 104, which is mounted on a trolley 200 and which accommodates photopolymer plates 102 (see FIG. 2), and a delivery section 106, which takes out the photopolymer plates 102 accommodated at the plate accommodation section 104. On the surface plate 110, one of the photopolymer plates 102 is held in position. The exposure section 112 records an image onto the photopolymer plate 102 that is held in position on the surface plate 110.

Further, an automatic developing device 116 can be established at the downstream side of the automatic exposure device 100, via a buffer section 114. Thus, plate feeding, exposure and developing can all be processed automatically.

Figure 2:
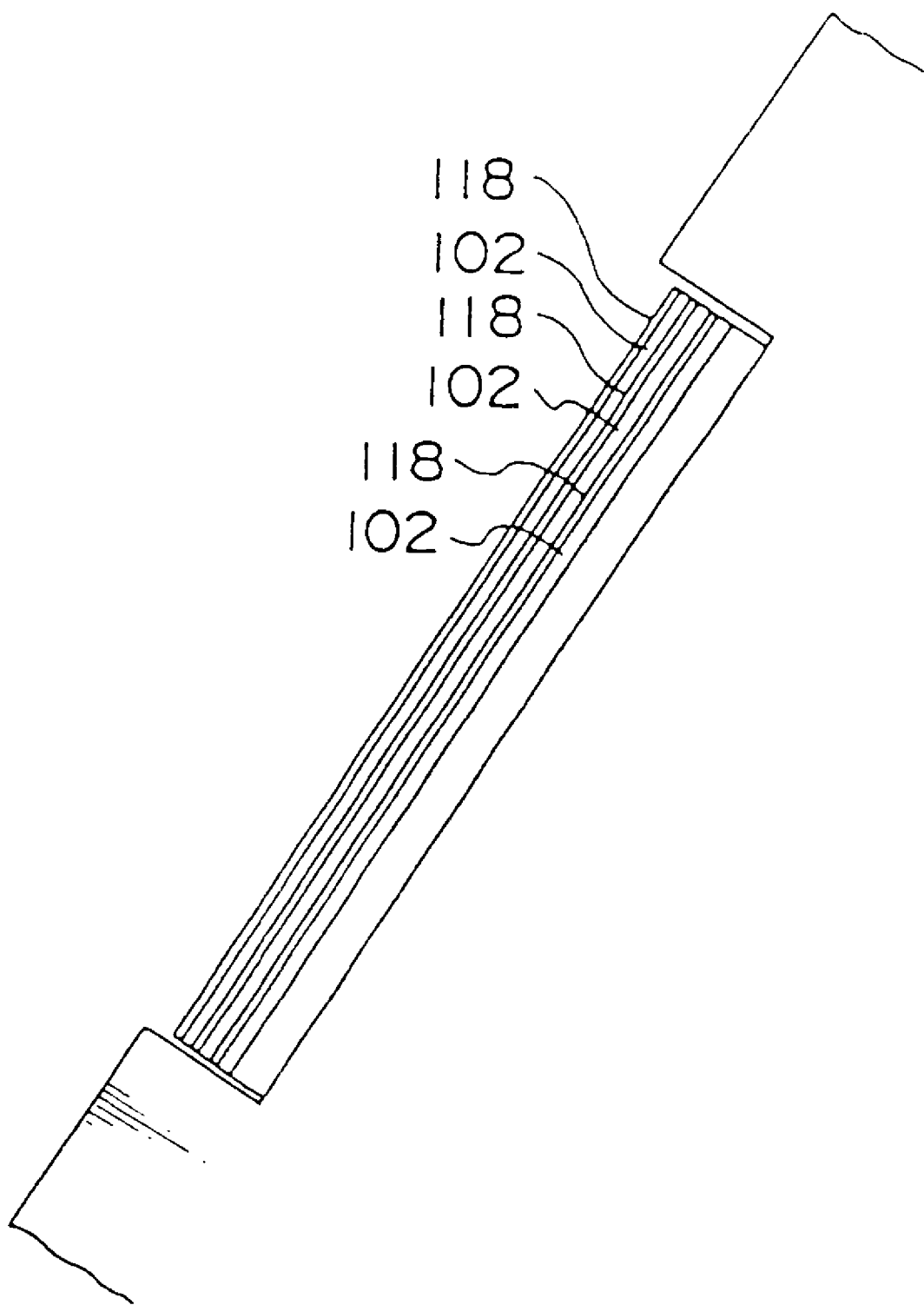
FIG. 2 is a side view showing a state of photopolymer plates and intermediate sheets mounted in a magazine.
Figure 3:
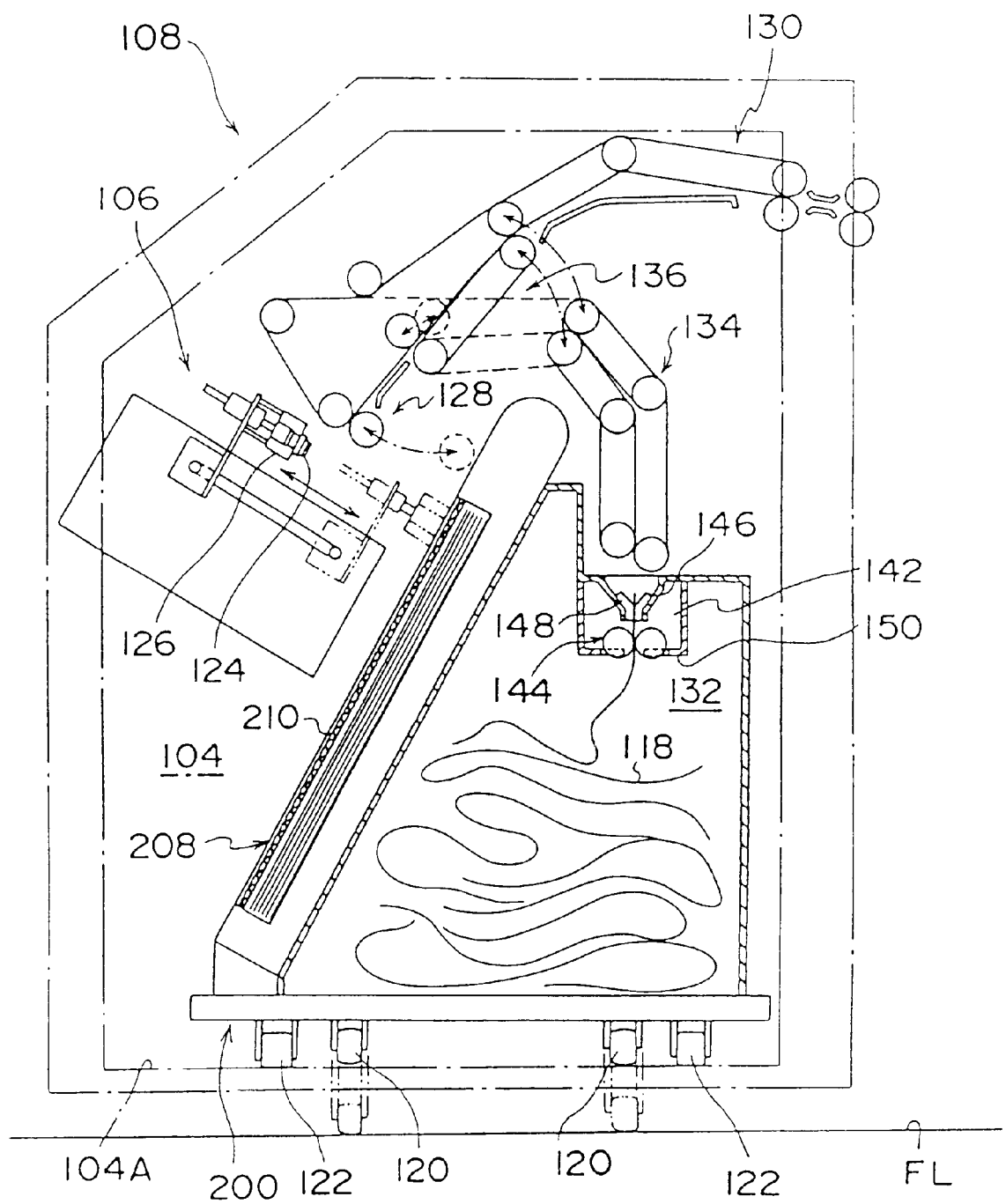
FIG. 3 is a side view of a plate feed portion.

As shown in FIG. 3, a trolley 200, at which a plurality of photopolymer plates 102 are propped up, can be accommodated by the plate accommodation section 104. Further, as shown in FIG. 2, one protective interleaf sheet 118 is provided at the surface of each photopolymer plate 102. Thus, the photopolymer sheets 102 and the interleaf sheets 118 are stacked alternately.

A floor portion 104A of the plate accommodating section 104 is formed at a position higher than a track surface. The trolley 200 is a structure that lifts from the track surface to the floor portion 104A. That is, the trolley 200 is supported relative to the track surface by casters 120, which casters 120 can each be moved relative to the trolley 200 between an extended position (a position shown by broken lines in FIG. 3) and an accommodated position (a position shown by solid lines in FIG. 3).

In accordance with an accommodation movement to the plate accommodating section 104, the casters 120 move so as to fold upwards into the accommodated position and, at the same time, help rollers 122 correspond with the floor portion 104A. Subsequently, the trolley 200 is supported relative to the floor portion 104A by the help rollers 122.

A delivery section 106 is provided at the upper portion of the plate accommodation section 104. The delivery section 106 alternately takes photopolymer plates 102 and interleaf sheets 118 from the stacked state thereof and passes them onto the plate feed section 108. The delivery section 106 is provided with a sucker 124 which sucks the photopolymer plates 102 and the interleaf sheets 118. Further, in the vicinity of the sucker 124 but separate from the sucker 124, a suction fan 126 is provided, as a means of assistance when one of the interleaf sheets 118 is being sucked. The sucker 124 and the suction fan 126 can be integrally moved closer to and further from the surface of the stack of interleaf sheets 118 and photopolymer plates 102.

When one of the photopolymer plates 102 is to be sucked, the sucker 124 makes contact with the photopolymer plate 102 and sucks. However, when one of the interleaf sheets 118 is to be sucked, the suction fan 126 is disposed a small distance from the interleaf sheet 118 (contact is acceptable) and the suction fan 126 operates alone such that only the lightweight, thin interleaf sheet 118 is sucked up, after which the sucker 124 starts to suck. Hence, when the interleaf sheet 118 is sucked, double suction (sucking the photopolymer plate 102 that is underneath together with the interleaf sheet 118) is prevented.

The major portions forming the plate feed section 108 are a common transport section 128, a photopolymer plate transport section 130, an intermediate sheet transport section 134, and a switching transport section 136. The common transport section 128 receives the photopolymer plates 102 and the interleaf sheets 118 from the aforementioned delivery section 106. The photopolymer plate transport section 130 receives the photopolymer sheets 102 and sends the same to the surface plate 110. The intermediate sheet transport section 134 receives the interleaf sheets 118 and sends the same to an intermediate sheet accommodation box 132 (mounted at the trolley 200). The switching transport section 136 switches to guide a photopolymer plate 102 or interleaf sheet 118 from the common transport section 128 to one of the photopolymer plate transport section 130 and the intermediate sheet transport section 134.

The photopolymer plates 102 and the interleaf sheets 118 are alternately stacked. Therefore, the switching transport section 136 switches each time the delivery section 106 sucks and the plate feed section 108 is a structure that transports the photopolymer plates 102 and the interleaf sheets 118 respectively in predetermined directions.

Figure 4A:
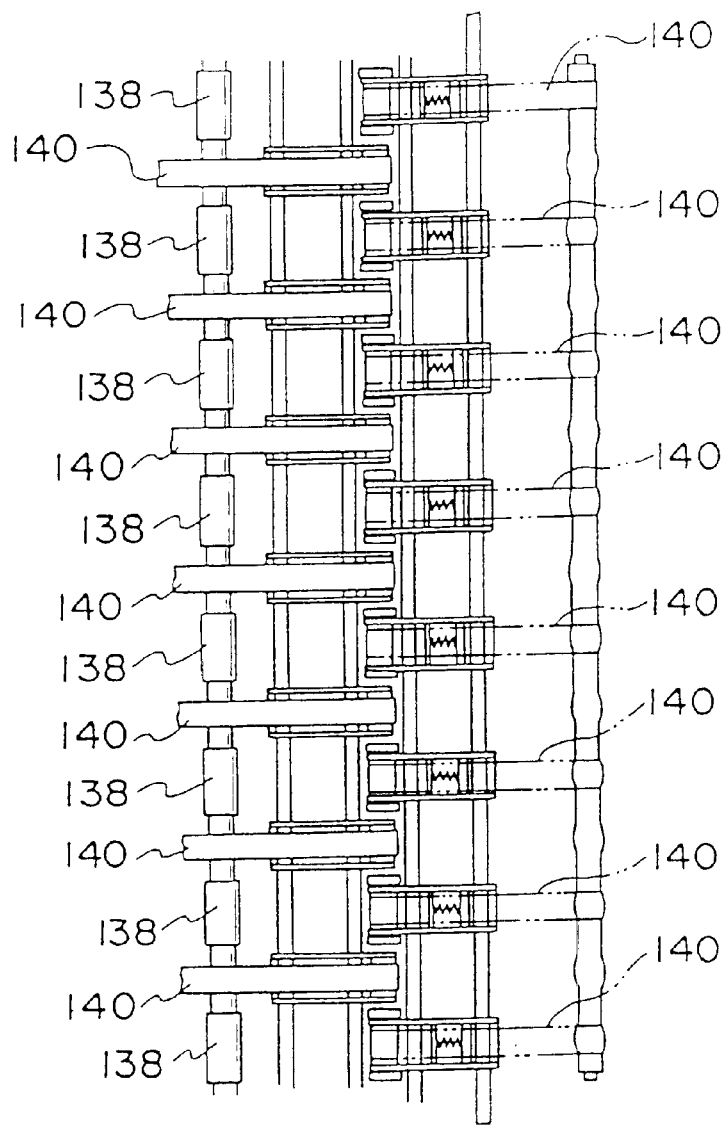
FIGS. 4A, 4B and 4C are plan views respectively showing a part of a transport apparatus of the plate feed portion.
Figure 4B:
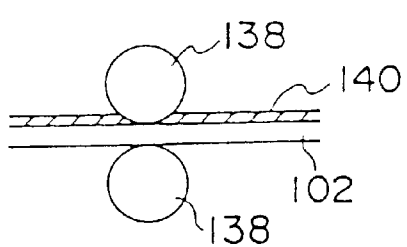

As shown in FIG. 4A, at the common transport section 128, the photopolymer plate transport section 130 and the switching transport section 136, skewered rollers 138 and narrow belts 140 are combined to form a transport system, whose main purpose is transporting the photopolymer plates 102 (see FIG. 4B). The photopolymer plates 102 are transported by strong gripping force of the skewered rollers 138, and the narrow belts 140 serve as moving guide plates during transport.

Figure 4C:
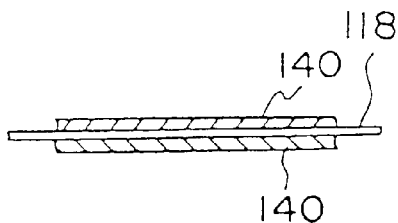

At the intermediate sheet transport section 134, however, narrow belts 140 alone form a transport system, as shown in FIG. 4C. In this structure, the interleaf sheets 118 are transported by the weak gripping force of the narrow belts 140.

Figure 5:
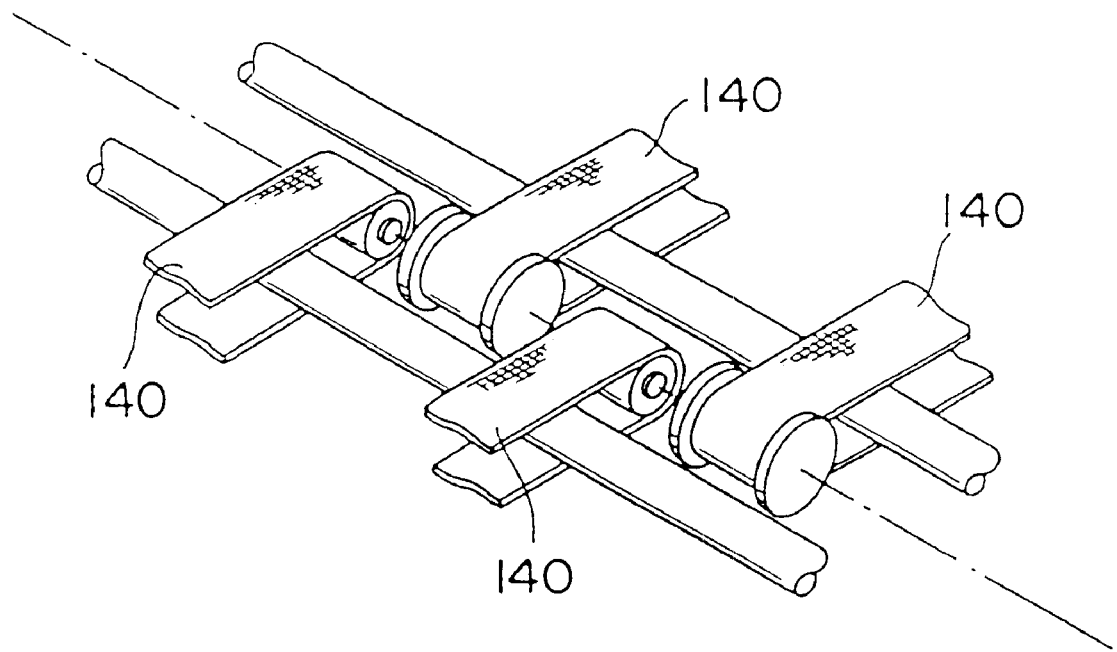
FIG. 5 is a perspective view showing a transfer portion of a transport apparatus, which is not a plate feed portion.

As shown in FIG. 5, the hand-over portion between two transport sections is in a skewered shape with end portions of the transport sections protruding respectively alternately, such that where one transport section protrudes the other recedes, and vice versa. Thus, the two transport sections intermesh from opposite sides (with narrow belt end portion support rollers having a common axis). Therefore, at a time of hand-over of one of the photopolymer plates 102 or one of the interleaf sheets 118, wrapping thereof around the skewered rollers 138 and the narrow belts 140 is prevented.

As shown in FIG. 3, the interleaf sheets 118 that are transported by the intermediate sheet transport section 134 are guided to the intermediate sheet accommodation box 132 provided at the trolley 200. A pair of rollers 144 are provided at an interleaf sheet 118 insertion slot 142, which insertion slot is provided at the upper portion of the intermediate sheet accommodation box 132. The rollers 144 are rotarily driven at a linear speed slightly faster than the speed of the intermediate sheet transport section 134 (about 1.1 times as fast). Thus, when one of the interleaf sheets 118 passes down between the rollers 144, the interleaf sheet 118 maintains a state of predetermined tension as it is transported, and jamming due to slackness or the like can be prevented.

Further, at the intermediate sheet transport section 134 side of the insertion slot 142, guide plates 146 are provided which gradually taper to reduce the width therebetween (which width is in the direction of thickness of the interleaf sheets 118) and which face each other. At the thus tapered guide plates 146, anti-static brushes 148 are respectively attached, which anti-static brushes 148 remove electric charge from the interleaf sheets 118 that are inserted into the insertion slot 142.

Each of the aforementioned pair of rollers 144 has a skewered form. Partition boards 150 are provided such that edges thereof follow along projections and indentations of each of these skewered shapes. Hence, after interleaf sheets 118 have been accommodated in the intermediate sheet accommodation section 132, even if a part of one of the accommodated interleaf sheets 118 touches one of the rollers 144, the respective partition board 150 can prevent the interleaf sheet 118 wrapping around that roller 144.

Figure 6A:
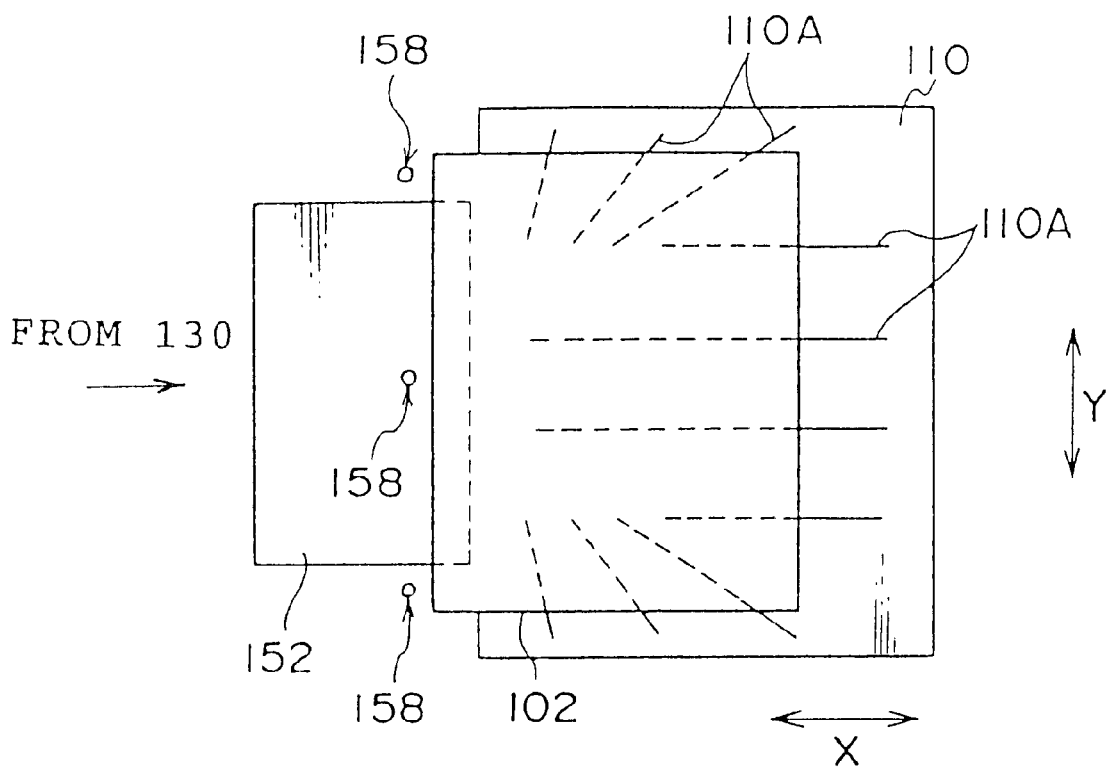
FIG. 6A is a plan view of a surface plate.

As shown in FIG. 6A, the one of the photopolymer plates 102 transported by the photopolymer plate transport section 130 leaves the photopolymer plate transport section 130 in a horizontal state and is handed over to the surface plate 110.

A top surface height of the surface plate 110 is at a lower position than the height of horizontal transport from the photopolymer plate transport section 130, and a little separated therefrom in the transport direction. Therefore, when ejected from the photopolymer plate transport section 130, the photopolymer plate 102 hangs down a little when landing on the surface plate 110, and the transport direction back end of the photopolymer plate 102 is disposed in a position further toward the photopolymer plate transport section 130 side than the surface plate 110. A temporary support plate 154 (FIG. 6B) is disposed at a moving body 152, which is provided at the photopolymer plate transport section 130 side of the surface plate 110 and which can move toward or away from the surface plate 110. The temporary support plate 154 prevents the photopolymer plate 102 from hanging down.

Figure 9A:
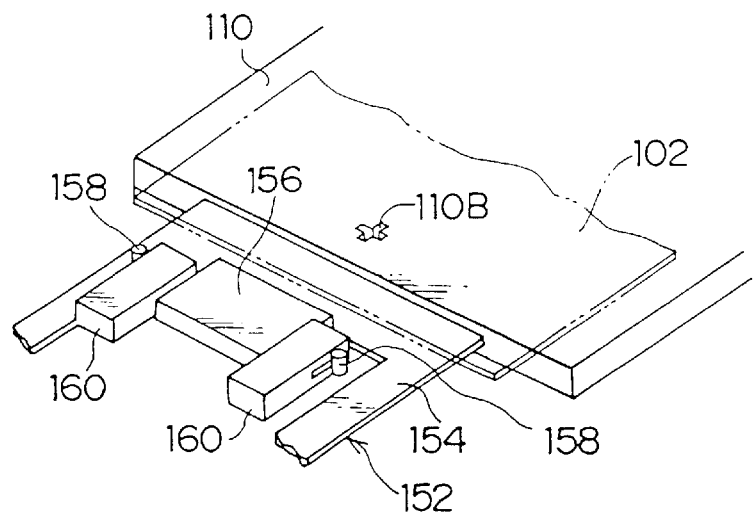
FIG. 9A is a perspective view of a surface plate and a displacement body for positioning on the surface plate.

Further, a cross-shaped suction hole 110B is formed at the surface plate 110, in order to temporarily hold the photopolymer plate 102 (FIG. 9A). Air is sucked from the suction hole 110B by the action of an unillustrated vacuum pump or the like. When the photopolymer plate 102 is over the suction hole 110B, the photopolymer plate 102 is held at one point.

A punching stage (described later) is disposed at one edge of the surface plate 110. The punching stage is a processing section for carrying out a punching process when the photopolymer plate 102 has been positioned.

Figure 6B:
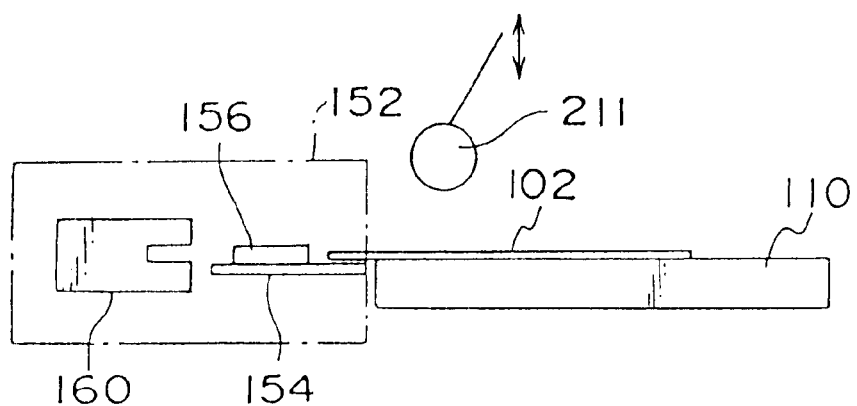
FIG. 6B is a side view of the surface plate.
Figure 9B:
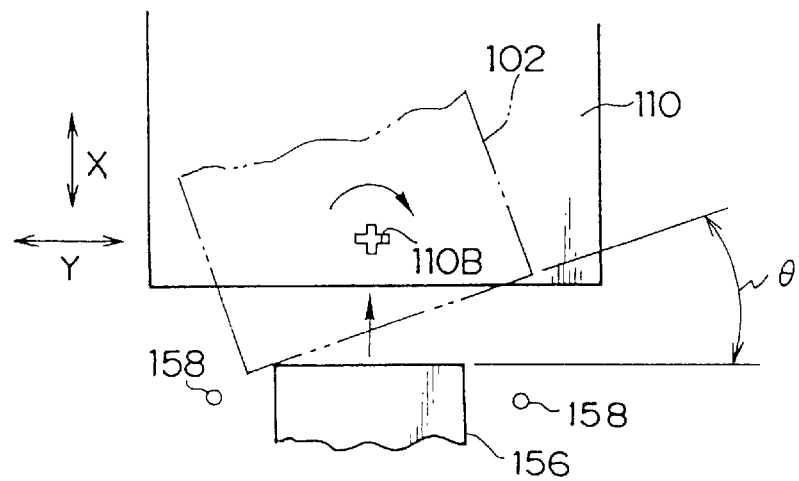
FIG. 9B is a plan view showing a photopolymer plate placed at an angle on the surface plate.
Figure 9C:
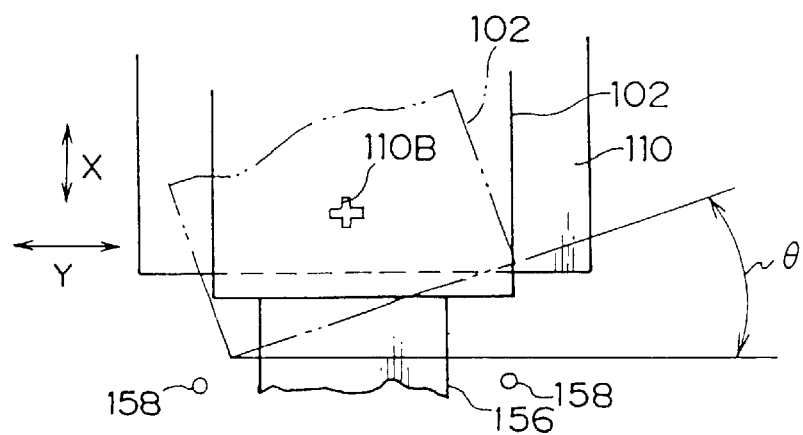
FIG. 9C is a plan view showing the situation after an angular error of FIG. 9B has been substantially eliminated.
Figure 10A:
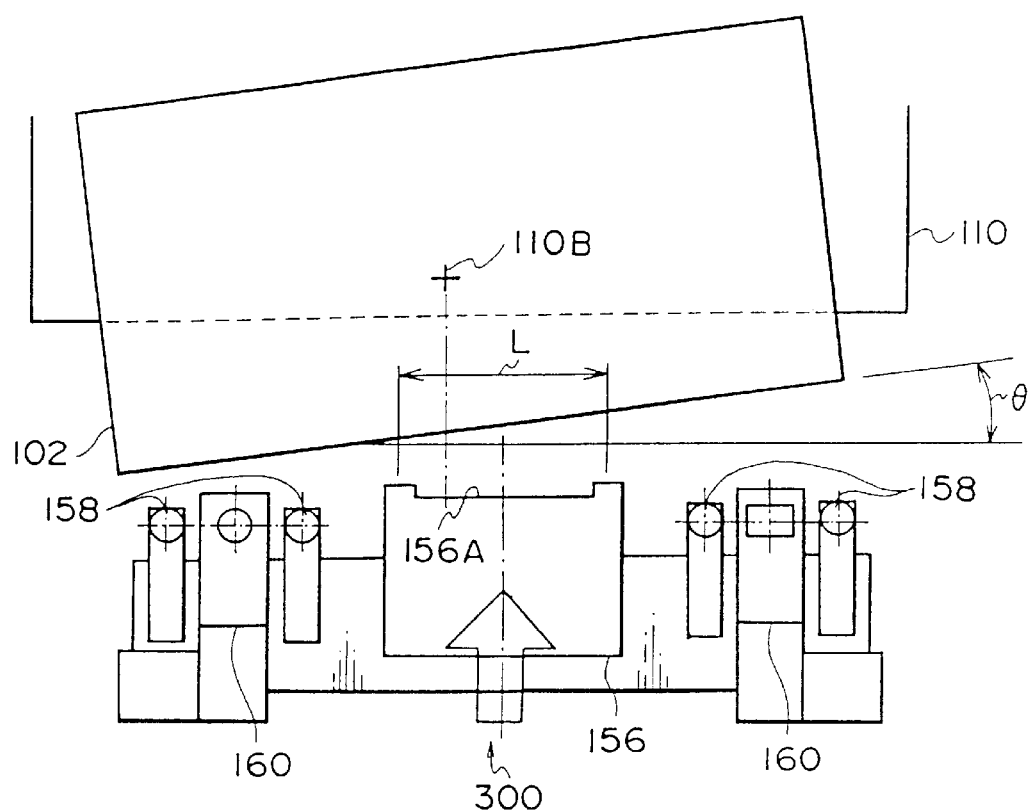
FIG. 10A is a plan view showing a photopolymer plate placed at an angle on the surface plate.
Figure 10B:
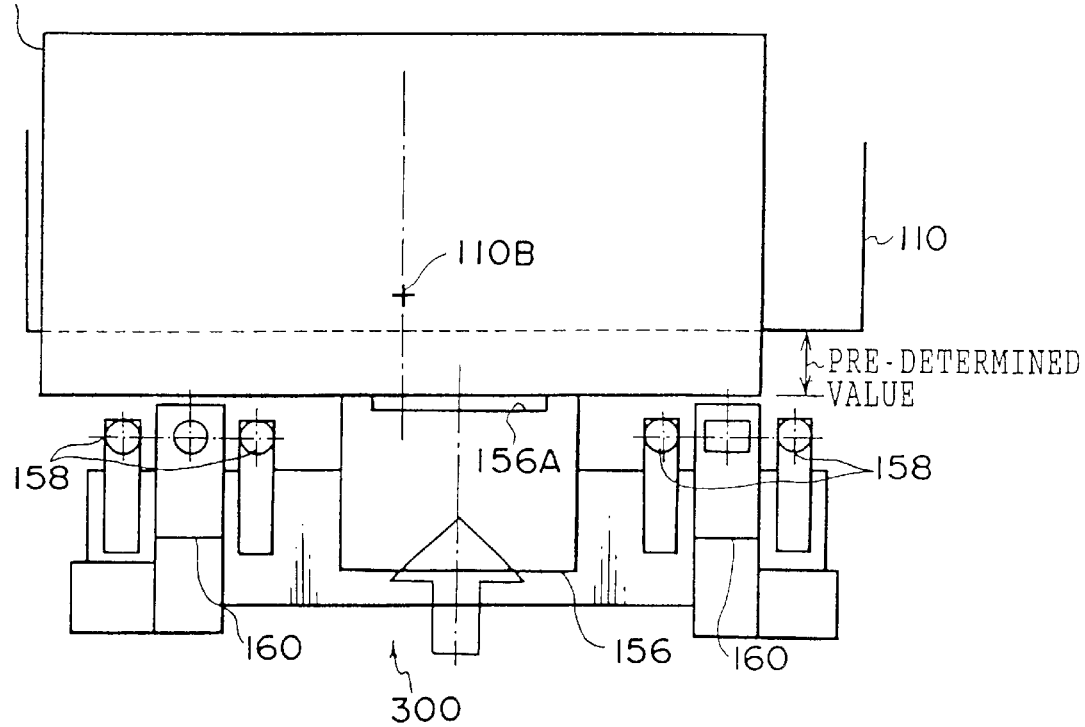
FIG. 10B is a plan view showing X-direction positioning after an angular error of FIG. 10A has been substantially eliminated.
Figure 11A:
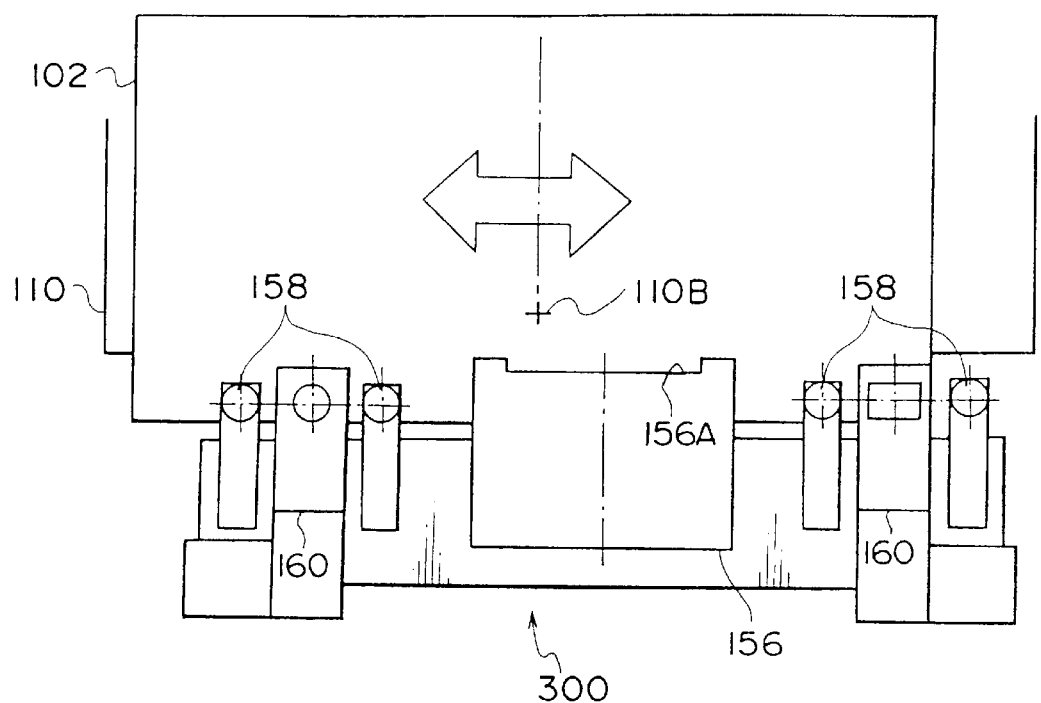
FIG. 11A is a plan view showing Y-direction positioning after the X-direction positioning of FIG. 10B.
Figure 11B:
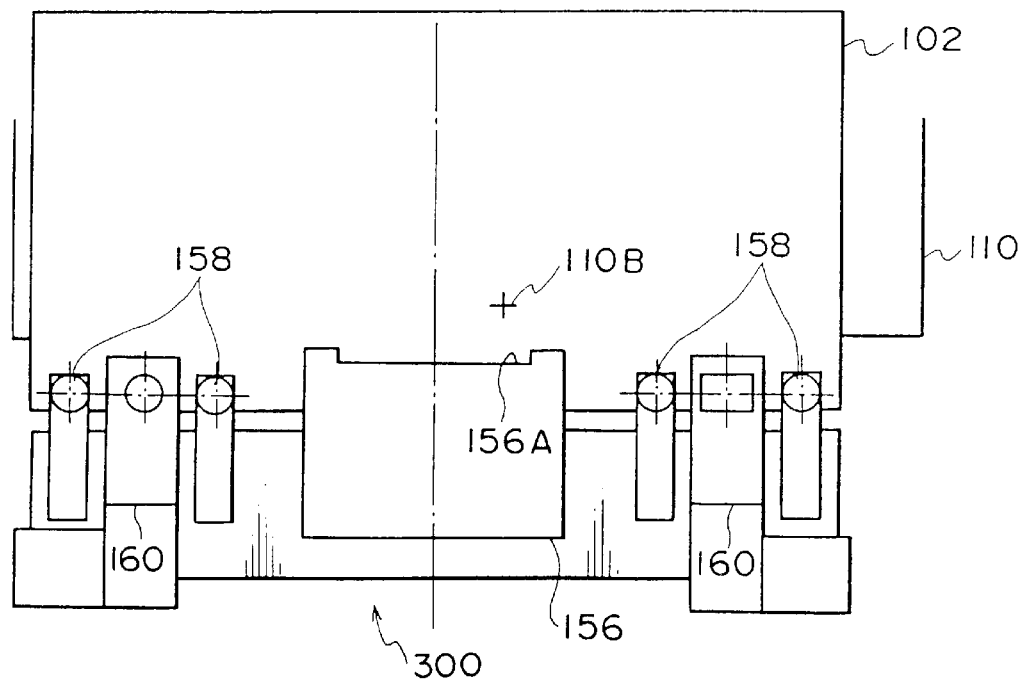
FIG. 11B is a plan view showing provision of punched holes after the Y-direction positioning of FIG. 11A.
Figure 12:
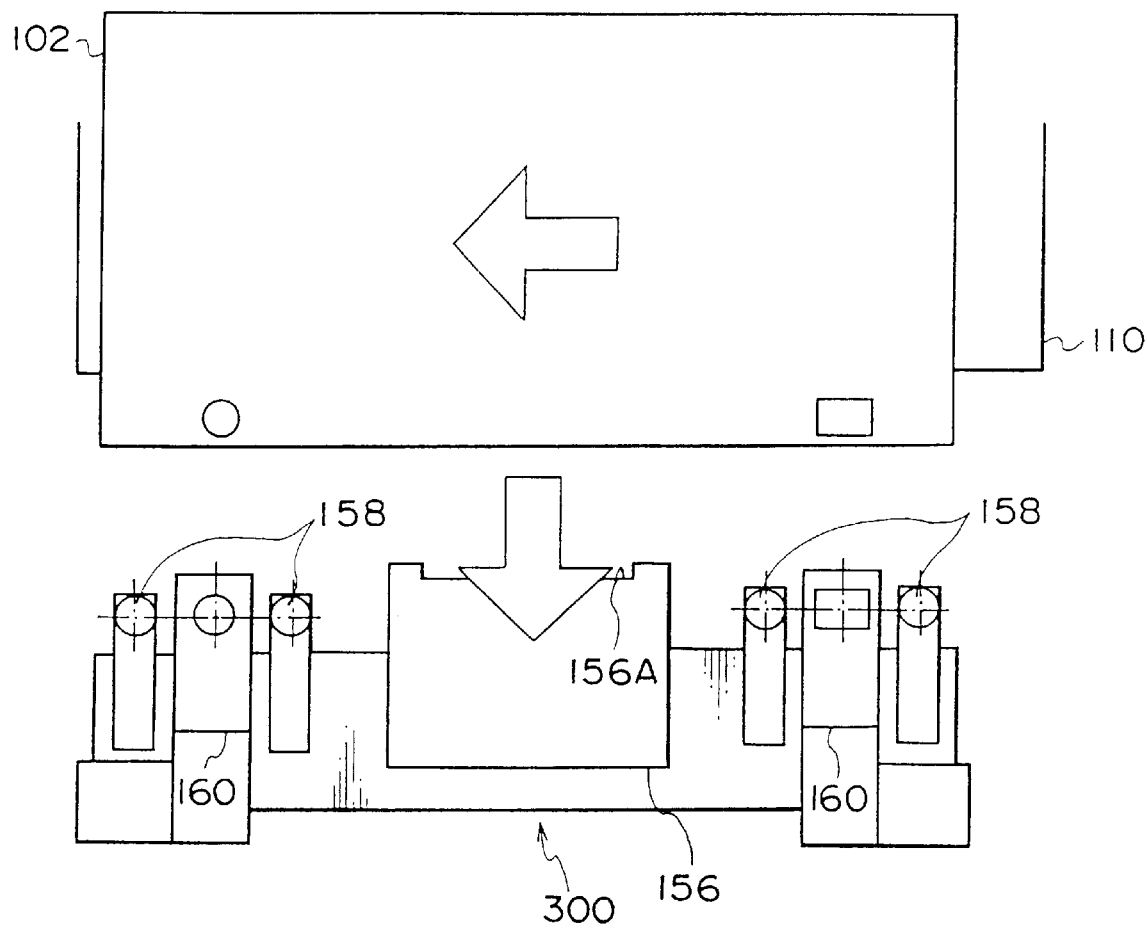
FIG. 12 is a plan view showing the situation after the provision of punched holes of FIG. 11B.

At one part of the punching stage, a pushing plate 156 is provided (FIGS. 6B and 9). The pushing plate 156 pushes the back end of the photopolymer plate 102 in the transport direction. Thus, an angular error of the photopolymer plate 102 (angle θ in FIGS. 9B and 9C) is substantially eliminated and the photopolymer plate 102 can be moved to a predetermined standard position in the transport direction. When the photopolymer plate 102 is at this standard position, the transport direction back end portion thereof is in a slightly projecting state from the surface plate 110. In FIGS. 9A, 9B and 9C, a pushing direction front end portion of the pushing plate 156 forms a straight line along a width direction of the pushing plate 156. However, the structure may instead be such that, rather than the pushing direction front end portion being a straight line along the width direction, a recessed portion is provided at a central portion of the pushing plate and the photopolymer plate is pushed only by width direction both end portions (described later).

At this time, the photopolymer plate 102 is held at a single point by the suction hole 110B. Thus, a resistive force respective to the pushing direction acts on the photopolymer plate 102. Therefore, the push of the pushing plate 156 merely rotates the photopolymer plate 102 about the holding point of the suction hole 110B, and the angular error of the photopolymer plate 102 can be substantially eliminated with very little displacement.

After the angular error with respect to the surface plate 110 has been substantially eliminated, the pushing plate 156 continues pushing. Thus, the photopolymer plate 102 is positioned in an X direction (which is a direction orthogonal to a direction in which the surface plate 110 can be moved, and is a main scanning direction at a below-described time of exposure).

This positioning is done by controlling the extent of pushing by the pushing plate 156. Confirmation that the angular error has been satisfactorily eliminated is performed with sensors 158 which are provided at a plurality of positions, including both corner portions of the transport direction back end portion of the photopolymer plate 102 (FIGS. 6A and 9A, 9B, 9C). Only two sensors are shown in FIGS. 9A, 9B and 9C, but there can be four sensors. Further, the sensors 158 are also used for position detection in a Y direction of the photopolymer plate 102 (which is the direction in which the surface plate 110 can be moved, and is a sub-scanning direction at the time of exposure). Specifically, the surface plate 110 moves in the Y direction to make the sensors 158 and the corners of the photopolymer plate 102 correspond. This position is recorded as an initial position of the photopolymer plate 102.

The photopolymer plate 102, which has been moved to the initial position, is positioned relative to an exposure scanning start position in an exposure section 112. The photopolymer plate 102 is held in this state by suction from suction channels 110A which are provided at the surface plate 110, such that the photopolymer plate 102 will not be significantly displaced in any direction.

Punch holes are provided at the photopolymer plate 102, which is being held by suction so as not to be significantly displaced in any direction, by punchers 160 disposed at the punching stage, which is provided at the aforementioned moving body 152.

Detailed Structure of the Punching Stage

FIGS. 9A, 9B and 9C only show the positional relationship of the punching stage and the surface plate, and the punching stage is drawn in simple form therein. Details of assembly structure of the punching stage are illustrated in FIGS. 10 through 13.

The pushing plate 156 is disposed on a width direction center line of a punching stage 300. A width direction center line of the pushing plate 156 and the width direction center line of the punching stage 300 are aligned with each other.

A cutout portion 156A is formed as a recess at the center of the pushing direction front end portion of the pushing plate 156. The pushing plate 156 pushes the photopolymer plate 102 such that the position of the holding point of the suction hole 110B is within a range L defined by both end portions of the cutout portion 156A (see FIG. 10A). As a result of the back end portion of the photopolymer plate 102 being pushed by the pushing plate 156, the angular error of the photopolymer plate 102 (angle θ in FIG. 10A) is eliminated.

Four sensors 158 are disposed along the width direction of the punching stage 300. Two sensors 158 are disposed at each side of the pushing plate 156.

Two punchers 160 are disposed along the width direction of the punching stage 300. One puncher 160 is disposed at each side of the pushing plate 156. Each puncher 160 is disposed between two of the sensors 158. Positions of the two punch holes provided at the photopolymer plate 102 by the punchers 160 and positions of the sensors 158 are disposed linearly along the width direction of the punching stage 300. The line of the punch holes is parallel to the line of the sensors 158.

When Y-direction positioning is finished, operation of the punchers 160 begins.

Figures 13A, 13B:
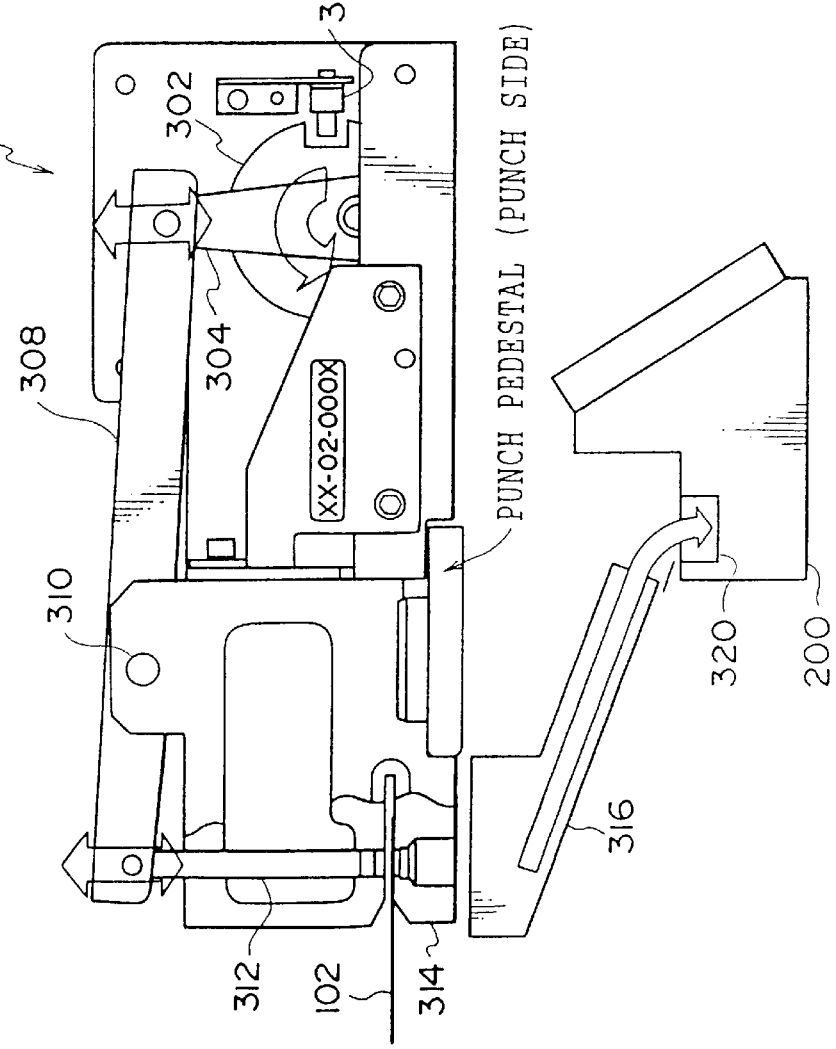
FIG. 13A is a side view of a puncher.
FIG. 13B is a rear view of a puncher.

One of the punchers 160 is shown in FIGS. 13A and 13B.

A D.C. geared motor is provided at the puncher 160. The D.C. geared motor is connected to a cam 302 such that when the D.C. geared motor is driven to rotate, rotary driving is transmitted to the cam 302. When the rotary driving is transmitted to the cam 302, the cam 302 rotates. A center of rotation of the cam 302 is at the intersection point of the dotted lines in FIG. 13B. A linker 304 is connected to the cam 302 at a position offset from the center of rotation of the cam 302. Before the cam 302 starts to rotate, a recess provided at the cam 302 is sandwiched by a punch sensor 306, portions of which are provided so as to face each other. The punch sensor 306 detects this recess. While the cam 302 is moving, the position of the recess changes along with rotation of the cam 302. Thus, the punch sensor 306 detects the presence of the cam 302.

When the cam 302 rotates, the rotation is converted to a stroke movement by the linker 304 connected to the cam 302. One end of a punch arm 308 is connected to the linker 304 and is caused to oscillate vertically by the stroke movement. The punch arm 308 oscillates about an axis 310 in the manner of a see-saw.

The punch arm 308 is a mechanism such that when the one end rises, another end drops, and when the one end drops, the other end rises. Because of the vertical oscillation, the one end of the punch arm 308 rises and the other end of the punch arm 308 drops correspondingly. Consequently, the mechanism is such that when the stroke movement is transmitted to the one end of the punch arm 308, the one end oscillates vertically and the vertical oscillation is transmitted, via the punch arm 308, to a punch 312 which is connected at the other end of the punch arm 308.

When the punch 312 drops, the punch 312 and a die 314 nip the photopolymer plate 102 therebetween. Thus, a punch hole is provided at the photopolymer plate 102.

Punched out pieces of photopolymer plate, which are generated when the punch holes are provided at the photopolymer plate 102, are transported to a punch waste container 320, which is provided at a trolley 200, via a chute 316 (see the arrow along the chute 316 in FIG. 13A).

When the recess in the rotating cam 302 is again detected by the punch sensor 306, the rotary driving of the D.C. geared motor stops, and the punch operation is completed. Namely, one full rotation of the recess corresponds to an operation to provide one punch hole.

Then, in order to be positioned along a direction transverse to the transport direction, the surface plate 110 can move at a uniform velocity in both directions between a number 1 position, at which the surface plate 110 receives the photopolymer plate 102 from the photopolymer plate transport section 130, (see the position shown by solid lines in FIG. 1) and a number 2 position, at which the surface plate 110 is accommodated at the exposure section 112 (see the position shown by broken lines in FIG. 1).

At the exposure section 112, a scanning unit 164 is provided above a transport path of the surface plate 110. A laser beam, whose light is controlled according to an image signal, forms a main scanner (in a direction orthogonal to a transport direction of the surface plate 110). Outward transport of the surface plate 110 (toward the exposure section 112) is a sub-scanning movement. Thus, at the exposure section 112, an image is recorded onto the photopolymer plate 102 on the surface plate 110 at the time of the outward transport. The surface plate 110 is returned to an original position by return transport (away from the exposure section 112). Then, after the photopolymer plate 102 on the surface plate 110 has been returned to the original position, the suction holding the photopolymer plate 102 is released.

Figure 7A:
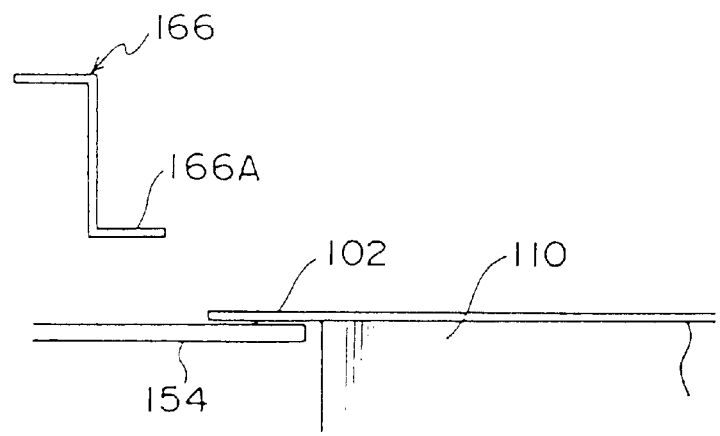
FIG. 7A is a side view showing the operation of a feedout mechanism portion at a time when operation begins.

In response to the image being written and the surface plate 110 being returned to the original position, an eject mechanism section 166, which is prepared at the side of the photopolymer plate transport section 130 where the photopolymer plate 102 transport direction back end is disposed, passes above the surface plate 110 and moves toward the photopolymer plate 102 transport direction front end (see FIG. 7A).

Figure 7B:
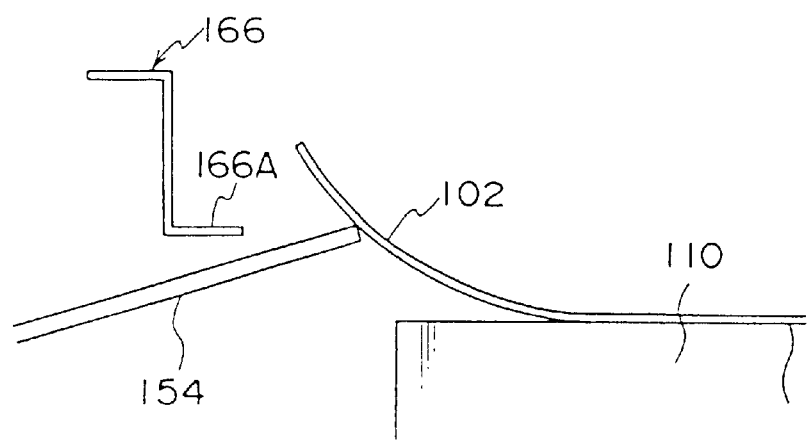
FIG. 7B is a side view showing the operation of a feedout mechanism portion when a photopolymer plate is being lifted up.
Figure 7C:
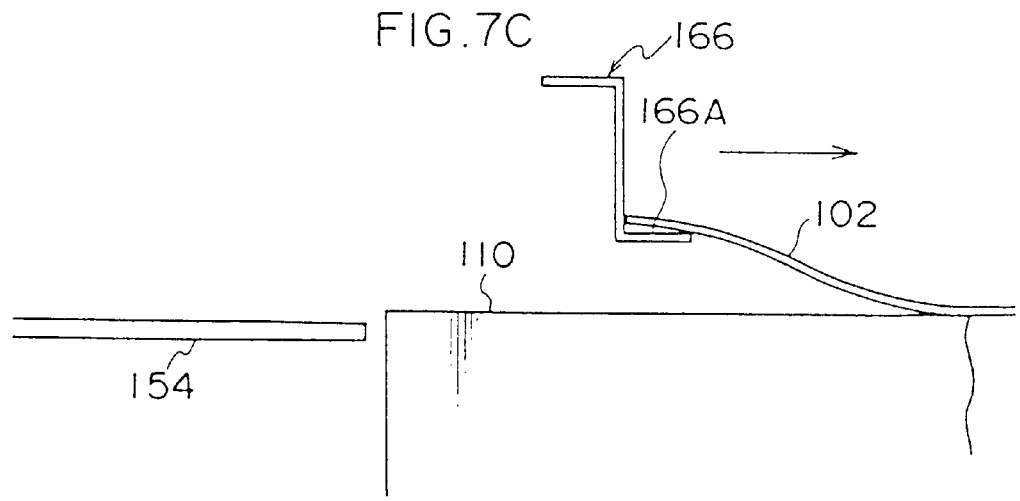
FIG. 7C is a side view showing the operation of a feedout mechanism portion at a time of feedout.

At the eject mechanism section 166, a hook portion 166A is formed, onto which the photopolymer plate 102 transport direction back end mounts. The temporary support plate 154 provided at the moving body 152 lifts up the photopolymer plate 102 back end portion that protrudes from the surface plate 110 (see FIG. 7B). As the eject mechanism section 166 moves in the photopolymer plate 102 transport direction, the photopolymer plate 102 is engaged by the hook portion 166A and moves along with the eject mechanism section 166. Thus, the photopolymer plate 102 is transported to a downstream side of the surface plate 110 (see FIG. 7C). At the downstream side, a buffer section 114 and an automatic development device 116 are provided. The buffer section 114 absorbs a difference between an ejection speed of the eject mechanism section 166 and a transport speed of the automatic development device 116, and delivers the photopolymer plates 102 smoothly.

Detailed Structure of the Trolley 200

The trolley 200 is shown in FIGS. 1, 3 and 8. The trolley 200 has a loading platform 202, which is supported at a track surface FL via the four casters 120 (only two of which are shown in FIG. 8). A handle 204 is attached at the loading platform 202. The handle 204 is substantially curved in a U shape. Both ends of the handle 204 are abuttedly fixed at the loading trolley 202.

An accumulation section 206, which holds the stacked photopolymer plates 102, is provided at the loading trolley 202. Viewed from the side, this accumulation section 206 is substantially in the form of a right-angled triangle. A magazine 208, which accommodates the photopolymer plates 102, is propped up at a slanted face portion of the accumulation section 206.

At the magazine 208, tens of photopolymer plates 102 are stacked in advance (normally 60 plates, but up to 100 plates is possible). Further, a shutter 210 is provided at the magazine 208. Except when in a darkroom, this shutter 210 is left in a closed state to prevent exposure of the photopolymer plates 102.

That is, the trolley 200 can convey the photopolymer plates 102 between the aforementioned accommodation section 104 and a darkroom in which the photopolymer plates 102 are stored, and the shutter 210 can protect the photopolymer plates 102 during conveyance.

The side of the trolley 200 to which the handle 204 is attached faces backward at a time of conveyance. The handle 204 is accommodated at the plate accommodation section 104.

The operation of the present embodiment is described below.

The plate feed section 108 exit side is at a higher position than the surface plate 110 top surface. Therefore, when one of the photopolymer plates 102 is handed over from the plate feed section 108 to the surface plate 110, the photopolymer plate 102 is reliably laid on the surface plate 110.

At that time, movement of the photopolymer plate 102 is not limited in any way. Therefore, the photopolymer plate 102 may be placed at an angle with respect to the surface plate 110 (see FIG. 10A).

Next, in this embodiment, the angular error with respect to the surface plate 110 should be substantially eliminated.

Suction from the suction hole 110B provided at the surface plate 110 begins. Because of this suction, the photopolymer plate 102 is held at one point with respect to the surface plate 110.

In this state, the pushing plate 156 is moved, and pushes one end of the photopolymer plate 102. However, the photopolymer plate 102 is held by suction from the suction hole 110B. Thus, there is a resistive force counteracting the push of the pushing plate 156. Hence, the photopolymer plate 102 moves almost entirely by rotation about the suction hole 110B. The rotation continues until the pushing plate 156 pushing surface and the one end of the photopolymer plate 102 coincide (see FIG. 10B).

A separation distance of a transport direction back end edge of the photopolymer plate 102 from a transport direction back end edge of the surface plate 110 is required to be set to a predetermined separation amount. To enable this setting, the pushing plate 156 continues moving after the angular error of the photopolymer plate 102 with respect to the surface plate 110 has been corrected. The pushing plate 156 pushes the transport direction back end edge of the photopolymer plate 102. When the separation thereof from the transport direction back end edge of the surface plate 110 reaches the prescribed amount, movement of the pushing plate 156 is stopped (see FIG. 10B).

Thus, the photopolymer plate 102 is positioned in the X direction with respect to the surface plate 110.

When X-direction positioning has been completed, the whole surface of the photopolymer plate 102 is sucked and held onto the surface plate 110 by the suction channels 110A, and one-point suction by the suction hole 110B is released.

Then the pushing plate 156 rises to a position higher than the surface of the photopolymer plate 102, and the punching stage 300 moves to a specified position near the photopolymer plate 102.

At this time, confirmation that the angular error of the photopolymer plate 102 has been accurately corrected is performed by the sensors 158.

In this state, the photopolymer plate 102 is positioned in the Y direction. Conventionally, the relative position of the photopolymer plate 102 with respect to the surface plate 110 is changed in the same manner as for the X direction. However, in the present embodiment, the relative positions of the surface plate 110 and the photopolymer plate 102 are not changed. The surface plate 110 is moved in the Y direction. While the surface plate 110 is moving in the Y direction, the sensors 158 detect an end portion of the photopolymer plate 102 and at that time the movement of the surface plate 110 is stopped. Thus, Y-direction positioning is performed (see FIG. 11A).

Y-direction positioning is completed when the center line in the width direction of the photopolymer plate 102 coincides with the center line in the width direction of the punching stage 300. Then, the punch holes are provided at predetermined positions in the photopolymer plate 102 by the punchers 160 (see FIG. 11B).

When the punchers 160 have provided the punch holes, the punching stage 300 is moved backward along the transport direction of the photopolymer plate 102. The whole surface of the photopolymer plate 102 continues to be sucked and held by the suction channels 110A on the surface plate 110, and the photopolymer plate 102 is transported to the exposure section 112.

At this point, a surface plate is usually fixed. Thus, for example, the relative positions of a puncher and an exposure section are decided such that punch holes can be provided at predetermined positions and an image can be recorded in a predetermined area. However, when the surface plate 110 in the present embodiment is moved, the relative position of the surface plate 110 is altered. Therefore, in the present embodiment a position at the end of positioning, based on displacement from an original position of the surface plate 110, is recorded as an initial position. Thus, the relative positions of the punchers and the exposure section 112 can be made to correlate.

As described above, in the present embodiment, the suction hole 110B is provided at the surface plate 110. Thus, the freely landed state of the photopolymer plate 102 fed from the plate feed section 108 is held at one point. Thus, at the time of pushing by the pushing plate 156, the photopolymer plate 102 merely rotates about the suction hole 110B. Thus, the angular error is substantially eliminated, and displacement of the photopolymer plate 102 during substantial elimination of the angular error can be reduced. Further and subsequently, X-direction positioning is performed by the push of the pushing plate 156, and Y-direction positioning is done by movement of the surface plate 110. Thus, the number of components can be reduced compared to conventional mechanisms that position by abutting a photopolymer plate against pins and the like, and the weight of the surface plate 110 can be lightened. Consequently, the movement torque of the surface plate 110 can be reduced.

In addition, in the present embodiment the photopolymer plate 102 is held at one point by the suction hole 110B provided at the surface plate 110. However, the photopolymer plate 102 could also be held at one point by being gripped between the surface plate 110 and a blunt member 211 provided above the photopolymer plate 102, which member would be a spherical body or the like without sharp corners. See FIG. 6B for a schematic representation of the blunt member 211.

What is claimed is:

1. A method for positioning a printing plate, which has been disposed on a surface plate, relative to said surface plate wherein the printing plate and surface plate are movable in a first direction relative to one another, the method comprising a step of rotating the printing plate, while holding the printing plate at a point on either a front or back face surface of said printing plate, about said point by pushing an edge of said printing plate for thereby substantially eliminating an angular error with respect to said surface plate.

2. The method of claim 1, further comprising the step of providing a holding structure at said surface plate for holding said printing plate at said point.

3. The method of claim 2, wherein the step of providing a holding structure includes providing a blunt member for the holding structure opposing said printing plate, and said holding of the printing plate comprises pressing the blunt member against the printing plate at said point.

4. A method for positioning a printing plate, which has been disposed on a surface plate, relative to said surface plate wherein the printing plate and surface plate are movable in a first direction relative to one another, the method comprising:

rotating the printing plate, while holding the printing plate at a point, about said point by pushing an edge of said printing plate for thereby substantially eliminating an angular error with respect to said surface plate, and providing a holding structure at said surface plate for holding said printing plate at said point, wherein the step of providing a holding structure includes providing a suction hole in the holding structure.

5. A method for positioning a printing plate, which has been placed on a surface plate, relative to said surface plate, comprising:
- a step of rotating said printing plate by pushing an edge thereof for thereby substantially eliminating an angular error; and
- a step of providing a holding structure, comprising a suction hole, at said surface plate for holding said printing plate at a point on a surface of said printing plate during said step of rotating.

6. A method for positioning a printing plate, which has been placed on a surface plate, relative to said surface plate, comprising:
- a step of rotating said printing plate by pushing an edge thereof for thereby substantially eliminating an angular error; and
- a step of providing a holding structure at said surface plate for holding said printing plate at a point on either a front or back face surface of said printing plate,
- wherein the step of providing a holding structure includes providing a blunt member for the holding structure above said printing plate and pressing the blunt member against the printing plate at said point.

7. A method for positioning a printing plate, which has been disposed on a surface plate, relative to said surface plate wherein the printing plate is movable along a first direction relative to said surface plate, the method comprising steps of:
- (a) rotating the printing plate, while holding the printing plate at a point, about said point by pushing an edge of said printing plate for thereby substantially eliminating an angular error with respect to said surface plate;
- (b) continuing said pushing, thereby positioning said printing plate in said first direction;
- (c) subsequently moving said surface plate in a second direction substantially orthogonal to said first direction, thereby positioning said printing plate in said second direction using a plurality of printing plate detection sensors; and
- (d) setting a resultant position of said surface plate as an initial position.

8. The method of claim 7, further comprising a step of, after said printing plate has been positioned in said first and second directions, holding a surface of said printing plate for fixing said printing plate's position with respect to said surface plate.

9. The method of claim 7, further comprising a step of providing a holding structure at said surface plate for holding said printing plate at said point.

10. The method of claim 9, further comprising a step of providing a holding portion having at least one channel for holding a surface of said printing plate.

11. A printing plate positioning device for positioning a printing plate relative to a surface plate, wherein the printing plate has been moved onto the surface plate from a predetermined transport path along a transport direction, the device comprising:
- (a) a movable body disposed proximate a side of said surface plate, said movable body being movable towards and away from said surface plate to thereby move said printing plate;
- (b) a plurality of sensors, disposed proximate said surface plate, operable for detecting said printing plate presence at predetermined positions; and
- (c) a first holding portion and a second holding portion provided at said surface plate, for holding a non-edge surface of said printing plate, wherein said first holding portion is capable of holding said surface of said printing plate while said printing plate is being moved by said movable body.

12. The printing plate positioning device of claim 11, further comprising a pushing portion provided at a portion of said surface plate, operable for pushing an end of said printing plate along said transport direction.

13. The printing plate positioning device of claim 12, wherein said first holding portion includes a suction hole.

14. The printing plate positioning device of claim 12, wherein said first holding portion comprises a blunt member positioned above said printing plate when said printing plate is on the surface plate, the blunt member being for pressing said printing plate at a point for holding said printing plate.

15. The printing plate positioning device of claim 11, wherein said second holding portion is operable for holding a surface of said print plate on said surface plate.

16. The printing plate positioning device of claim 15, wherein said second holding portion includes at least one channel.

17. The printing plate positioning device of claim 11, further comprising an ejection structure having a hook portion for engaging an end of said printing plate, provided at an elevation above said surface plate for removing said printing plate from said surface plate.

18. The printing plate positioning device of claim 11, wherein said first holding portion comprises a blunt member positioned above said printing plate when said printing plate is on the surface plate, the blunt member being for pressing said printing plate at a point for holding said printing plate.

19. A printing plate positioning device for positioning a printing plate relative to a surface plate, wherein the printing plate has been moved onto the surface plate from a predetermined transport path, the device comprising:
- a holding device provided at a surface of said surface plate, said holding device for holding said printing plate on said surface plate such that said printing plate is rotatable with respect to said surface plate about one point of said printing plate, wherein said point is on a face surface of said printing plate; and
- a pushing device disposed proximate a side of said surface plate, said pushing device for pushing an edge of said printing plate while said printing plate is held by said holding device and thereby rotating said printing plate about said one point of said printing plate for thereby substantially eliminating an angular error with respect to said surface plate in a direction of rotation.

20. A printing plate positioning device for positioning a printing plate, which has been disposed on a surface plate, relative to said surface plate wherein the surface plate is movable along a first direction, the device comprising:
- a holding device provided at a surface of said surface plate, said holding device for holding said printing plate on said surface plate such that said printing plate is rotatable with respect to said surface plate about one point of said printing plate;
- a first pushing device disposed proximate a side of said surface plate, said first pushing device for pushing an edge of said printing plate while said printing plate is held by said holding device and thereby rotating said printing plate about said one point of said printing plate for thereby substantially eliminating in a direction of rotation an angular error with respect to said surface plate;
- a second pushing device disposed proximate a side of said surface plate, said second pushing device for pushing an edge of said printing plate, after said first pushing device has substantially eliminated said angular error, for thereby positioning said printing plate along a second direction substantially orthogonal to said first direction of the surface plate; and a detection portion operable for detecting a position along said first direction of said printing plate at a time at which said printing plate is moved along said first direction by movement of said surface plate after said printing plate has been positioned along said second direction, wherein said printing plate is positioned in accordance with said detection portion, and a resultant position of said surface plate is set as an initial position.

21. The printing plate positioning device of claim 20, wherein a single pushing device constitutes said first pushing device and said second pushing device, said single pushing device performing substantial elimination of said angular error and positioning along said first and second directions in a continuous manner.

22. The printing plate positioning device of claim 21, further comprising a punching device disposed proximate a transport direction back end edge of said printing plate for punching punch holes along an edge portion of said printing plate after said printing plate has been positioned along said first direction and said second direction.

23. The printing plate positioning device of claim 20, further comprising a punching device disposed proximate a transport direction back end edge of said printing plate for punching punch holes along an edge portion of said printing plate after said printing plate has been positioned along said first direction and said second direction.

* * * * *